(12) United States Patent
Chae

(10) Patent No.: US 7,618,903 B2
(45) Date of Patent: Nov. 17, 2009

(54) SOFT MOLD, METHOD OF MANUFACTURING THE SAME, AND PATTERNING METHOD USING THE SAME

(75) Inventor: Gee Sung Chae, Inchon-si (KR)

(73) Assignee: LG Display Co., Ltd., Seoul (KR)

( * ) Notice: Subject to any disclaimer, the term of this patent is extended or adjusted under 35 U.S.C. 154(b) by 306 days.

(21) Appl. No.: 11/441,062

(22) Filed: May 26, 2006

(65) Prior Publication Data

US 2006/0275018 A1 Dec. 7, 2006

(30) Foreign Application Priority Data

Jun. 7, 2005 (KR) .................. 10-2005-0048157

(51) Int. Cl.
*H01L 21/31* (2006.01)
(52) U.S. Cl. .................. 438/780; 264/219; 430/302; 430/322; 430/324; 257/E23.124
(58) Field of Classification Search .................. 438/780; 264/219; 430/302, 322, 324
See application file for complete search history.

(56) References Cited

U.S. PATENT DOCUMENTS

2003/0044727 A1* 3/2003 Park et al. .................. 430/320
2005/0206048 A1* 9/2005 Ryu et al. .................. 264/614

FOREIGN PATENT DOCUMENTS

| JP | 03-038314 | 2/1991 |
| JP | 2002-270541 | 9/2002 |
| JP | 2004-299153 | 10/2004 |

* cited by examiner

*Primary Examiner*—Alexander G Ghyka
(74) *Attorney, Agent, or Firm*—Morgan Lewis & Bockius LLP

(57) ABSTRACT

The patterning method includes forming a synthetic resin layer on a substrate, providing a mold in which a predetermined pattern is formed and metal particles are distributed on the surface of the mold, contacting the mold having the predetermined pattern with the synthetic resin layer, transferring the pattern of the mold onto the synthetic resin layer to form a patterned synthetic resin layer, and forming an organic layer on the patterned synthetic resin layer.

4 Claims, 6 Drawing Sheets

SOFT MOLD, METHOD OF MANUFACTURING THE SAME, AND PATTERNING METHOD USING THE SAME

This application claims the benefit of Korean Patent Application No. 2005-48157 filed in Korea on Jun. 7, 2005, which is hereby incorporated by reference.

BACKGROUND OF THE INVENTION

1. Field of the Invention

The present invention relates to a soft mold, a method of manufacturing the same and a patterning method using the same, and more particularly, to a soft mold, the lifetime of which is extended, a method of manufacturing the same and a patterning method using the same.

2. Discussion of the Related Art

As semiconductor devices are scaled down and highly integrated, the technology of forming a pattern to enhance new functions has attracted considerable attention. The lithography technology is one kind of patterning technology that has become a core technology in fabricating semiconductor devices. Currently, suggested various methods are capable of economically embodying a nano-scale pattern as well as a micro-scale pattern using simplified processes.

However, current nano-patterning technology with high integration degree demands high technology expense in view of apparatus and processes therefor. Moreover, there is a physical limitation in using a polymer material formed of a conventional photosensitizer, and also some problems such as low patterning speed, poor resolution, difficulty in being applicable to a curved surface, etc. Therefore, in order to resolve these problems, a soft-lithography technology has been proposed, which is different from the typical photolithography technology.

According to the soft-lithography technology, a pattern or a structure is formed by repeatedly smearing an organic material on a soft polymer stamp without utilizing light or high-energy particles. That is, the pattern is transferred onto a synthetic resin or the like by smearing predetermined ink on the polymer stamp. Herein, one of polymer materials acting as the polymer stamp is PolyDiMethylSiloxane (PDMS). In the typical photolithography technology, complicated etching processes should be repeatedly performed. However, using PDMS enables the processes to be simple, wherein the PDMS can be easily applied to a specific region such as a large area portion or a curved surface, and also it is possible to selectively coat a thin film.

FIGS. 1A to 1C are sectional views illustrating a method of forming a pattern using a PDMS mold according to the related art. As shown in FIG. 1A, a substrate 560 is coated with a resin layer 550a, and then a PDMS mold 510 with a predetermined pattern is deposited on the resin layer 550a. Herein, the predetermined pattern of the PDMS mold 510 has a concave-and-convex shape. As shown in FIG. 1B, the PDMS mold 510 is brought into contact with the coated resin layer 550a, thereby transferring the predetermined pattern onto the coated resin layer 550a to form a resin layer 550. Thus, the resin layer 550 has a convex-and-concave pattern. In general, both the organic material in the polymer and the organic material in the transited object have hydrophobic properties.

As illustrated in FIG. 1B, during the process of using the PDMS mold 510 to transfer the pattern, the surface of the PDMS mold 510 is gradually damaged due to the PDMS mold 510 continuously contacting the coated resin layer 550a. For this reason, CH— is easily separated from the surface of the PDMS mold 510, which may occur locally or broadly at the surface of the PDMS mold 510. Thus, when the PDMS mold 510 is repeatedly utilized, a material exchange occurs between the PDMS mold 510 and the coated resin layer 550a.

As shown in FIG. 1C, the coated resin layer 550a is changed into the patterned resin layer 550 having the predetermined pattern of the PDMS mold 510 by contacting the PDMS mold 510 with the coated resin layer 550a. Like the process as illustrated in FIG. 1B, as the number of times of utilizing the PDMS mold 510 increases, the material exchange occurs between the PDMS mold 510 and the patterned resin layer 550. Thus, the surface of the patterned resin layer 550 formed by the PDMS mold 510, which has been repeatedly utilized, tends to be hydrophobic. Accordingly, it impossible to form another organic layer on the patterned resin layer 550 because a wetting contact angle cannot be formed.

FIG. 2 is a graph illustrating a relationship between contact angle variations of the patterned resin surface and the number of times of utilizing the PDMS mold according to the related art. As illustrated in FIG. 2 in view of FIGS. 1A to 1C, a dashed line A represents an intrinsic contact angle of the coated resin layer 550a. In a predetermined range from the dashed line A to a dashed line B, as the number of times of utilizing the PDMS mold 510 increases, the contact angle becomes higher because more CH— is easily separated from the surface of the PDMS mold 510, thereby causing the PDMS mold 510 to be gradually hydrophobic. Thus, when the PDMS mold 510 is repeatedly utilized, the material exchange occurs between the PDMS mold 510 and the resin layer 550. As a result, the surface of the PDMS mold 510 becomes hydrophobic.

Even if the contact angle of the PDMS mold 510 increases and the material exchange actively occurs between the PDMS mold 510 and the resin layer 550, as long as the contact angle is within the predetermined range from the dashed line A to the dashed line B of FIG. 2, it is possible, in light of a surface condition of the resin layer 550, to form another organic layer on the resin layer 550 because the organic layer and the resin 550 may contact well with each other within this contact angle range. However, if the contact angle is in a range from the dashed line B to a dashed line C of FIG. 2, since the wetting contact angle cannot be formed in light of the surface condition of the resin layer 550, it is difficult to form another organic layer on the resin layer 550, thereby making it impossible to perform a thin film process after all.

In conclusion, as the number of times of utilizing the PDMS mold 510 increases, the PDMS mold 510 becomes hydrophobic because CH— is separated from the surface thereof. Further, since no wetting contact angle is formed, another organic layer cannot be formed on the patterned resin layer 550. As a result, the resin layer 550 having the pattern transferred by the PDMS mold 510 cannot maintain its predetermined contact angle, thereby making it impossible to form another organic layer on the patterned resin layer 550. After all, the PDMS mold 510 cannot be repeatedly utilized because the repeat utilization makes the PDMS mold 510 hydrophobic.

SUMMARY OF THE INVENTION

Accordingly, the present invention is directed to a soft mold, a method of manufacturing the same and a patterning method using the same that substantially obviate one or more problems due to limitations and disadvantages of the related art.

An object of the present invention is to provide a soft mold capable of preventing the resin from becoming hydrophobic by reducing a surface area of a PDMS mold where an organic material is transited, and a patterning method using the same.

Additional advantages, objects, and features of the invention will be set forth in part in the description which follows, and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a soft mold includes a base mold in which a pattern is formed and metal particles formed on a surface of the base mold.

In another aspect of the present invention, a method of manufacturing a soft mold includes forming a first organic layer on a mold substrate, forming a convex and concave pattern on the first organic layer to form a mold, forming a second organic layer on the mold, transferring the pattern of the mold onto the second organic layer, and separating the second organic layer from the mold to form a base mold, and forming metal particles on the base mold.

In a further another aspect of the present invention, a patterning method includes forming a synthetic resin layer on a substrate, providing a mold in which a predetermined pattern is formed and metal particles are formed on the surface of the mold, contacting the mold having the predetermined pattern with the synthetic resin layer, transferring the pattern of the mold onto the synthetic resin layer to form a patterned synthetic resin layer, and forming an organic layer on the patterned synthetic resin layer.

In a still further another aspect of the present invention, a patterning method includes forming a synthetic resin layer on a substrate, providing a mold in which a hydrophobic-resist treatment is performed over a surface of the mold, contacting the mold with the synthetic resin layer, and transferring a pattern of the mold onto the synthetic resin layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 3A:
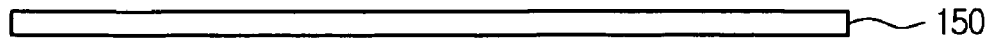
FIGS. 3A to 3G are sectional views illustrating a method of manufacturing a soft mold according to an exemplary embodiment of the present invention.
Figure 3B:
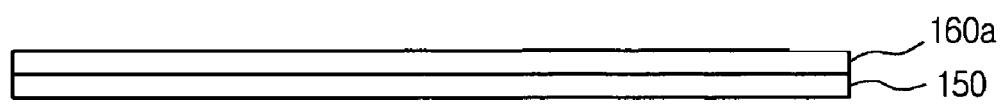
Figure 3C:
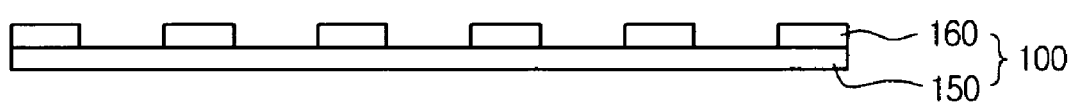
Figure 3D:
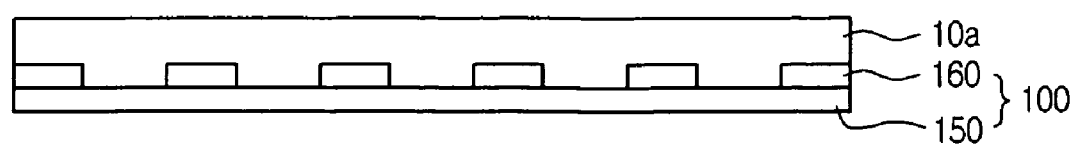
Figure 3E:

FIGS. 3A to 3G are sectional views illustrating a method of manufacturing a soft mold according to an exemplary embodiment of the present invention. According to this exemplary method of manufacturing a soft mold 1 (of FIG. 3G), as shown in FIG. 3A, a mold substrate 150 is prepared, and then a first organic layer 1 60a is deposited on the mold substrate 150 as shown in FIG. 3B. Preferably, the first organic layer 160a may be a photosensitizer. After that, as shown in FIG. 3C, the first organic layer 160a is patterned into a layer 160 using a photo-mask, thereby forming a mold 100 including the patterned layer 160 and the mold substrate 150. Further, as shown in FIG. 3D, a second organic layer 10a is cast in the mold 100 to be sintered. Then, as shown in FIG. 3E, the mold 100 is removed to form a base mold 10 as a stamp. In this exemplary embodiment, the base mold 10 includes PDMS, which is adaptive for easily obtaining a polymer and is convenient for stamping by appropriately controlling elasticity.

Figure 3F:
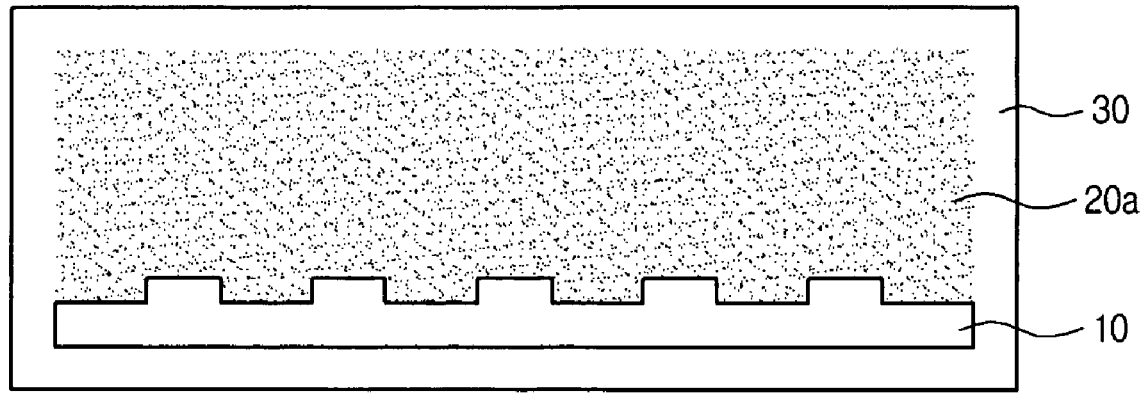
Figure 3G:

As shown in FIG. 3F, the thus-formed base mold 10 is transferred into a chamber 30, wherein a metal material 20a is provided in vapor state so that it is deposited on a surface of the base mold 10. Since the PDMS is transparent up to a predetermined thickness from the surface thereof, it is possible to print it while checking the contacting state of the transferred object with naked eyes or microscope, and further it is possible to easily change the surface condition of the stamp into hydrophobicity or hydrophilicity. Moreover, since the PDMS manufactured by the above method has low surface free energy and does not adhere to the PDMS mold when molding a polymer using the PDMS mold, it shows good formability and processability. In general, the organic material and the metallic material have hydrophilic properties. As shown in FIG. 3G, the metal material 20a is distributed over a surface of the base mold 10 to form metal particles 20, thereby forming the soft mold 1. Moreover, the metal particles 20 are distributed on a predetermined area on the surface of the soft mold 1. In this exemplary embodiment, the metal particles 20 have hydrophilic properties with respect to the organic material. Since the metal particles 20 are formed on the base mold 10, CH— can be prevented from being separated from the surface of the base mold 10.

In the related art, the separation of CH— is accelerated with the increasing number of times of contacting the base mold with the transferred object, i.e., the organic material. However, in the exemplary embodiment of the present invention, since the metal particles 20 are distributed on the surface of the base mold 10, CH— can be prevented from being separated from the surface of the base mold 10, thereby minimizing the occurrence of the material exchange between the base mold 10 and a synthetic resin layer 50a (of FIG. 4) and preventing the base mold 10 from becoming hydrophobic even though the base mold 10 is in contact with the synthetic resin 50a. Moreover, since a surface of the synthetic resin layer 50a does not become hydrophobic, the synthetic resin layer 50 can have a good wetting contact angle with respect to another organic layer. The soft mold 1 manufactured by the above exemplary method is an elastic polymer stamp, which can transfer a desired pattern on a surface of an object.

Figure 4A:
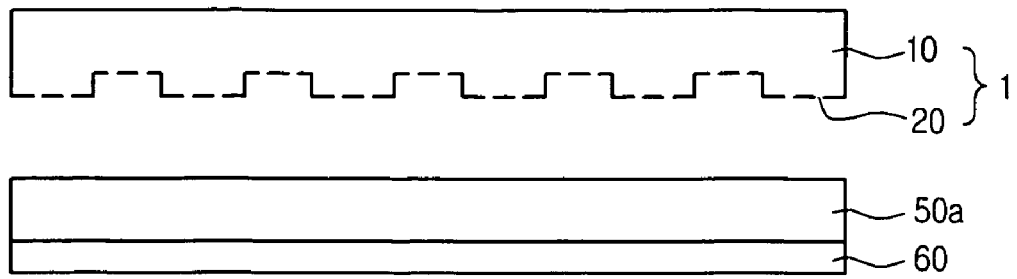
FIGS. 4A to 4D are sectional views illustrating a method of forming a pattern using the soft mold of FIGS. 3A to 3G.
Figure 4B:
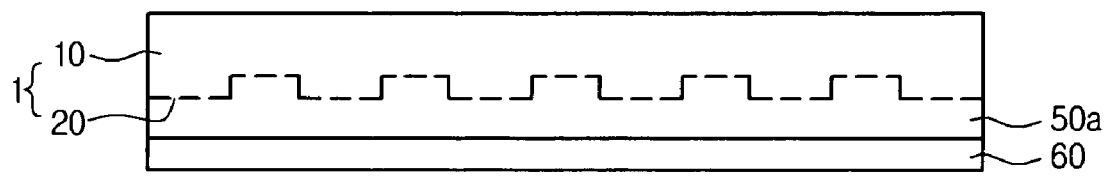

FIGS. 4A to 4D are sectional views illustrating an exemplary patterning method using the soft mold 1 of FIG. 3G. According to this exemplary patterning method, as shown in Fig, 4A, a substrate 60 is prepared to have the synthetic resin layer 50a disposed thereon, and further the soft mold 1 including the metal particles 20 and the base mold 10 is prepared. The soft mold 1 is shaped with a concave-and-convex organic pattern. Then, as shown in FIG. 4B, the substrate 60 is brought into contact with the soft mold 1, thereby transferring the concave-and-convex organic pattern onto the synthetic resin layer 50a so that the pattern is formed on the synthetic resin layer 50a. In this case, as the number of times of utilizing the soft mold 1 increases, the surface of the soft mold 1 is subject to damage, which may bring about the material exchange between the synthetic resin layer 50a and the soft mold I when the synthetic resin layer 50a and the soft mold 1 are in contact with each other.

Figure 1A:
FIG. 1A to 1C are sectional views illustrating a method of forming a pattern using a PDMS mold according to the related art.
Figure 1B:
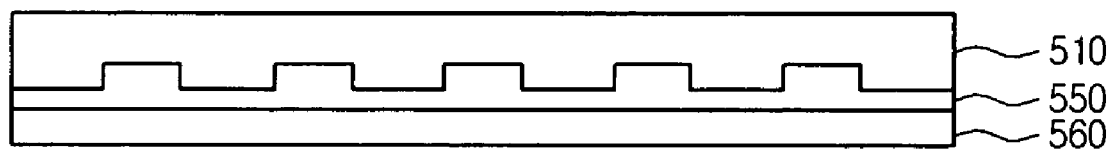
Figure 1C:
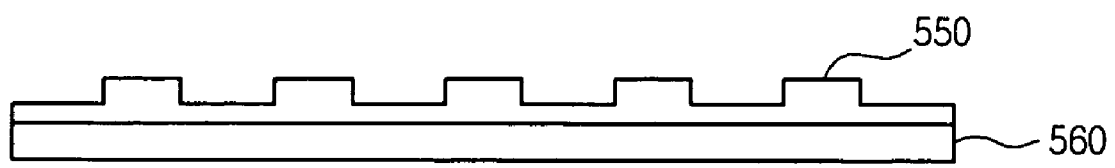
Figure 2:
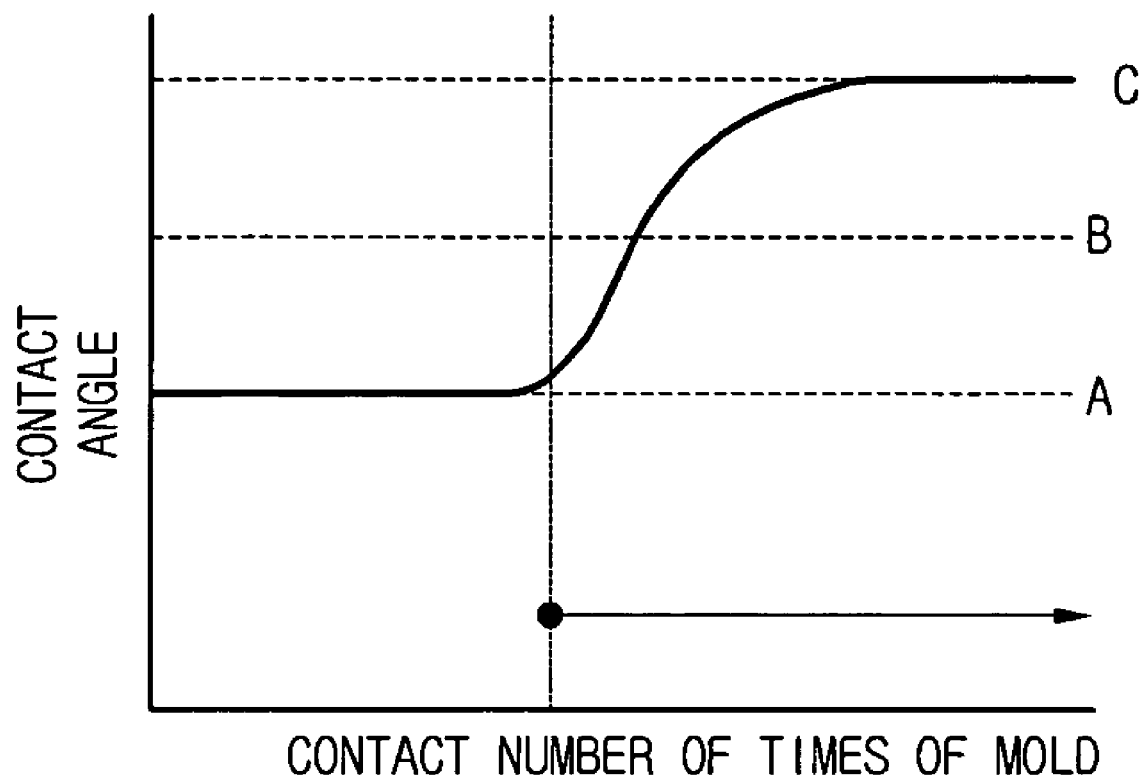
FIG. 2 is a graph illustrating a relationship between contact angle variations of a patterned resin surface and the number of times of utilizing the PDMS mold of FIGS. 1A to 1C.

Referring back to FIGS. 1A and 2, according to the related art, when the PDMS mold 510 and the synthetic resin layer 550a are in contact with each other, the surface of the PDMS mold 510 becomes hydrophobic due to the material exchange between the PDMS mold 510 and the synthetic resin layer 550a. Moreover, since the synthetic resin layer 550a tends to have hydrophobic properties, it is difficult to form a thin film of organic material due to the hydrophobic properties when another organic layer is to be coated on the resin layer 550 with the transferred pattern.

Figure 4C:
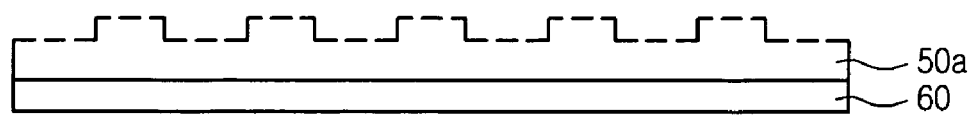
Figure 4D:
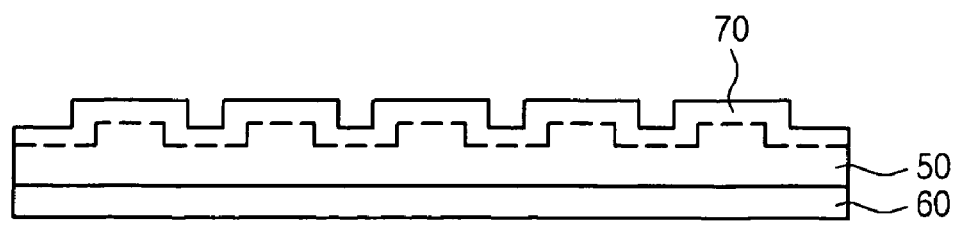

In the exemplary embodiment of the present invention, since the metal particles 20 are formed in advance on the predetermined distribution area on the surface of the base mold 10, the metal particles 20 can effectively inhibit the material exchange between the synthetic resin 50 and the base mold 10. As shown in FIG. 4C, the pattern of the soft mold 1 is transferred onto the synthetic resin layer 50a in order to form a patterned synthetic resin layer 50 (of FIG. 4D). In this case, the material exchange between the soft mold 1 and the patterned synthetic resin layer 50 is inhibited by the metal particles 20 disposed on the base mold 10 even though the soft mold 1 has been repeatedly utilized. As a result, the surface of the patterned synthetic resin layer 50 has a contact angle appropriate enough to have another organic layer formed thereon. Thus, as shown in FIG. 4D, another organic layer 70 can be formed on the patterned synthetic resin layer 50 because the metal particles 20 are distributed on the predetermined area to inhibit the material exchange between the base mold 10 and the patterned synthetic resin layer 50. Therefore, the metal particles 20 can minimize the occurrence of the material exchange, thereby forming the wetting contact angle between the patterned synthetic resin layer 50 and another organic layer 70. Also, since the contact area of the patterned synthetic resin layer 50 decreases, the patterned synthetic resin layer 50 can be prevented from becoming hydrophobic. Moreover, since the material exchange between the base mold 10 and the patterned synthetic resin layer 50 is effectively inhibited, even though the number of times of utilizing the soft mold 1 increases, the wetting contact angle can still be formed between the patterned synthetic resin layer 50 and another organic layer 70. As a result, the lifetime of the soft mold 1 can be extended.

Figure 5:
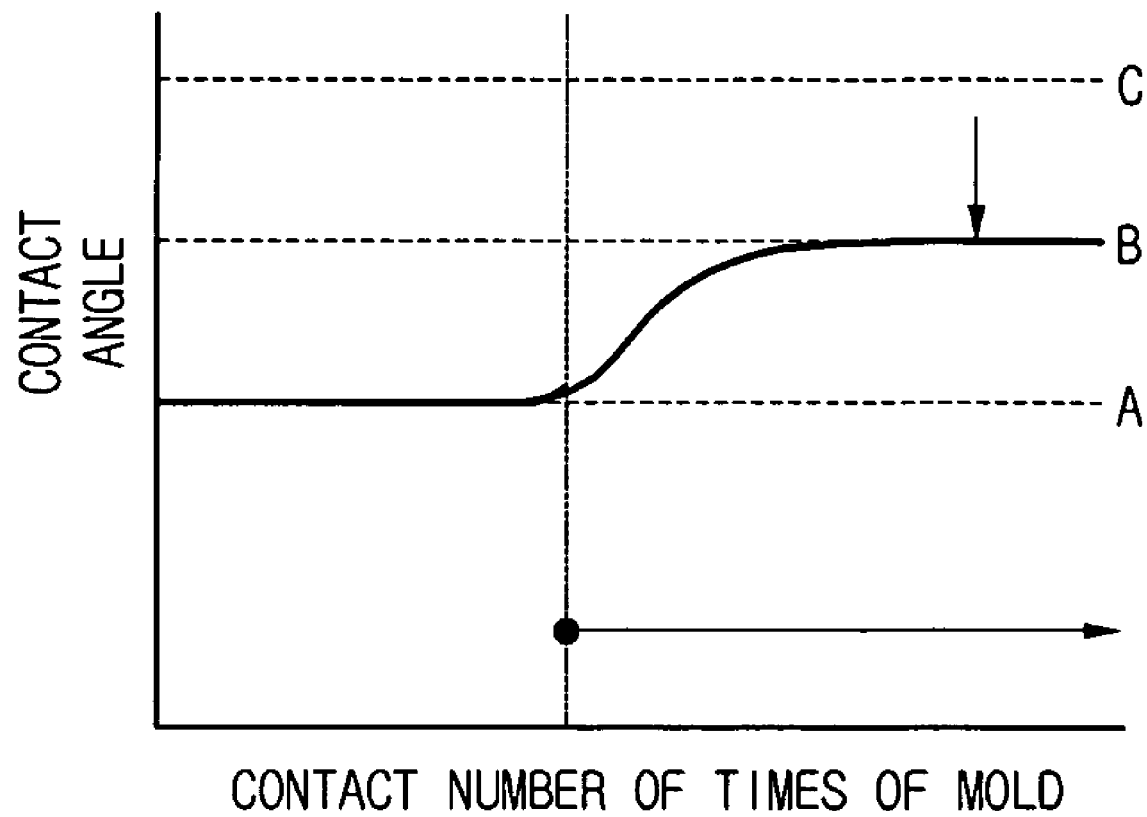
FIG. 5 is a graph illustrating a relationship between contact angle variations of the soft mold and the number of times of utilizing the soft mold of FIGS. 3A to 3G.

FIG. 5 is a graph illustrating a relationship between contact angle variations of the soft mold 1 and the number of times of utilizing the soft mold 1. As illustrated in FIG. 5 in view of FIGS. 4A to 4D, since the metal particles 20 are formed on the predetermined distribution area on the surface of the base mold 10, the occurrence of the material exchange can be minimized, thereby maintaining a predetermined contact angle between the patterned synthetic resin layer 50 and the organic layer 70. Thus, the organic layer 70 can be formed on the patterned synthetic resin layer 50. That is, since the metal particles 20 inhibit the material exchange between the soft mold 1 and the synthetic resin 50 due to the area friction, the contact area between the soft mold 1 and the patterned synthetic resin layer 50 also decreases, thereby preventing the patterned synthetic resin layer 50 from becoming hydrophobic. In other words, since the surface area of the patterned synthetic resin layer 50, which could have been affected by the soft mold 1, is reduced, the contact angle of the surface is maintained to be less than a predetermined value, even though the number of times of utilizing the soft mold 1 increases. As a result, the lifetime of the soft mold 1 can be extended. Moreover, since the lifetime of the soft mold 1 is extended, the material cost for manufacturing the soft mold 1 can also be reduced, and further the fabrication operation can be performed through low cost and simplified processes.

As described above, since the pattern is formed on the synthetic resin by contacting it with the soft mold in which the metal particles are formed on the base mold, the material exchange between the soft mold and the synthetic resin can be minimized and also the synthetic resin can be prevented from becoming hydrophobic. Therefore, the wetting contact angle can be formed between the synthetic resin and the organic layer regardless of the number of times of utilizing the soft mold, thereby extending the lifetime of the soft mold.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of manufacturing a soft mold, the method comprising:
   forming a first organic layer on a mold substrate;
   forming a convex and concave pattern on the first organic layer to form a mold;
   forming a second organic layer on the mold;
   transferring the pattern of the mold onto the second organic layer, and separating the second organic layer from the mold to form a base mold; and
   distributing metal material over a surface of the base mold to form metal particles in a chamber,
   wherein the metal particles have hydrophilic properties with respect to the second organic layer.

2. The method according to claim 1, wherein the first organic layer includes a photosensitizer material.

3. The method according to claim 1, wherein the second organic layer includes PolyDiMethylSiloxane (PDMS).

4. The method according to claim 1, wherein the metal particles are distributed on a predetermined area on the surface where the second organic layer is formed.

* * * * *